(12) United States Patent
Boniardi et al.

(10) Patent No.: US 11,037,613 B2
(45) Date of Patent: Jun. 15, 2021

(54) IMPLEMENTATIONS TO STORE FUSE DATA IN MEMORY DEVICES

(71) Applicant: Micron Technology, Inc., Boise, ID (US)

(72) Inventors: Mattia Boniardi, Cormano (IT); Anna Maria Conti, Milan (IT); Mattia Robustelli, Milan (IT); Innocenzo Tortorelli, Cernusco sul Naviglio (IT); Mario Allegra, Monza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/514,431

(22) Filed: Jul. 17, 2019

(65) Prior Publication Data

US 2021/0020218 A1     Jan. 21, 2021

(51) Int. Cl.
    *G11C 7/22*           (2006.01)
    *G11C 11/16*        (2006.01)

(52) U.S. Cl.
    CPC ...... *G11C 11/1673* (2013.01); *G11C 11/1659* (2013.01); *G11C 11/1675* (2013.01)

(58) Field of Classification Search
    CPC ............ G11C 11/1673; G11C 11/1675; G11C 11/1659
    USPC .................................................... 365/189.11
    See application file for complete search history.

(56) References Cited

U.S. PATENT DOCUMENTS

| 10,304,554 | B1 | 5/2019 | Sreeramaneni et al. |
| 2003/0223291 | A1 | 12/2003 | Nachumovsky et al. |
| 2010/0090213 | A1 | 4/2010 | Jeong et al. |
| 2013/0135925 | A1 | 5/2013 | Scheuerlein |
| 2017/0365353 | A1 | 12/2017 | Redaelli |
| 2018/0204843 | A1* | 7/2018 | Son .................. G11C 17/16 |
| 2020/0160927 | A1* | 5/2020 | Jung ................. H01L 45/04 |

OTHER PUBLICATIONS

ISA/KR, International Search Report and Written Opinion of the International Searching Authority, Int'l Appl. No. PCT/US2020/041436, dated Oct. 27, 2020, Korean Intellectual Property Office, Seo-gu, Daejeon, Republic of Korea, 11pgs.

* cited by examiner

*Primary Examiner* — Tha-O H Bui
(74) *Attorney, Agent, or Firm* — Holland & Hart LLP

(57) ABSTRACT

Methods, systems, devices, and other implementations to store fuse data in memory devices are described. Some implementations may include an array of memory cells with different portions of cells for storing data. A first portion of the array may store fuse data and may contain a chalcogenide storage element, while a second portion of the array may store user data. Sense circuitry may be coupled with the array, and may determine the value of the fuse data using various signaling techniques. In some cases, the sense circuitry may implement differential storage and differential signaling to determine the value of the fuse data stored in the first portion of the array.

20 Claims, 7 Drawing Sheets

IMPLEMENTATIONS TO STORE FUSE DATA IN MEMORY DEVICES

BACKGROUND

The following relates generally to operating at least one memory device and more specifically to implementations to store fuse data in memory devices.

Memory devices are widely used to store information in various electronic devices such as computers, wireless communication devices, cameras, digital displays, and the like. Information is stored by programming different states of a memory device. For example, binary devices most often store one of two states, often denoted by a logic "1" or a logic "0." In other devices or systems, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), other chalcogenide-based memory technologies, and others. Memory devices may be volatile or non-volatile. Improving memory devices, generally, may include increasing memory cell density, increasing read/write speeds, increasing reliability, increasing data integrity, reducing power consumptions, or reducing manufacturing costs, among other metrics. In some cases, a memory device may store data in a number of fuse-like structures or cells located at the periphery of the main memory array.

DETAILED DESCRIPTION

Memory devices may employ a number of different techniques to store data. In some cases, a memory device may store data permanently at the device so that the data may not be overwritten or lost, even in cases where the device loses power. Such data may be examples of information that is used by the memory device to operate the memory device. In some cases, such data may be stored by an array of fuses to ensure that the data is not lost. An array of fuses may be example of a read-only-memory (ROM) or programmable read-only memory (PROM), and may be useful in cases where unalterable data or instructions are stored in memory. In some cases, programming a ROM or a PROM may include "blowing" certain fuses or fusible links. Combinations of blown fuses and unblown fuses may represent a certain state of fuse data (e.g., either a "1" or "0" binary state). In some implementations, the array of fuses may be integrated as dedicated structures or circuitry located at the periphery of a memory device or array, or as a fuse array separate from the greater portion of the memory device or array.

This kind of fuse architecture and writing process, however, may have a number of drawbacks. For example, the portion of the memory device used for the fuses and drivers may occupy a significant amount of area, and the drivers (e.g., MOSFET transistors, bipolar transistors, etc.) used to blow fuses may use relatively high programming current, increasing the overall power consumption of the memory device.

Instead of a dedicated fuse array at the periphery of the memory array, a memory array may be configured within the memory device or the memory array to store fuse data. In some cases, the array storing the fuse data may be a subarray or portion of memory cells contained within the memory device. In some cases, the array storing the fuse data may be separate from the portions of the memory array storing other types of data, such as user data. In either case, the array for storing the fuse data may contain a chalcogenide storage element, and may programmed or reprogrammed multiple times. In addition, because the cells of the array for storing the fuse data may be programmed instead of irreversibly blown, the quantity of current drivers may be reduced and/or the size of current drivers may be reduced among other possible benefits.

Features of the disclosure are initially described in the context of a memory system and memory die as described with reference to FIGS. 1 and 2. Features of the disclosure are described in the context of a memory device or memory array as described with reference to FIGS. 3-5B. These and other features of the disclosure are further illustrated by and described with reference to an apparatus diagram and a flowchart that relate to implementations to store fuse data in memory devices as described with references to FIGS. 6-7.

Figure 1:
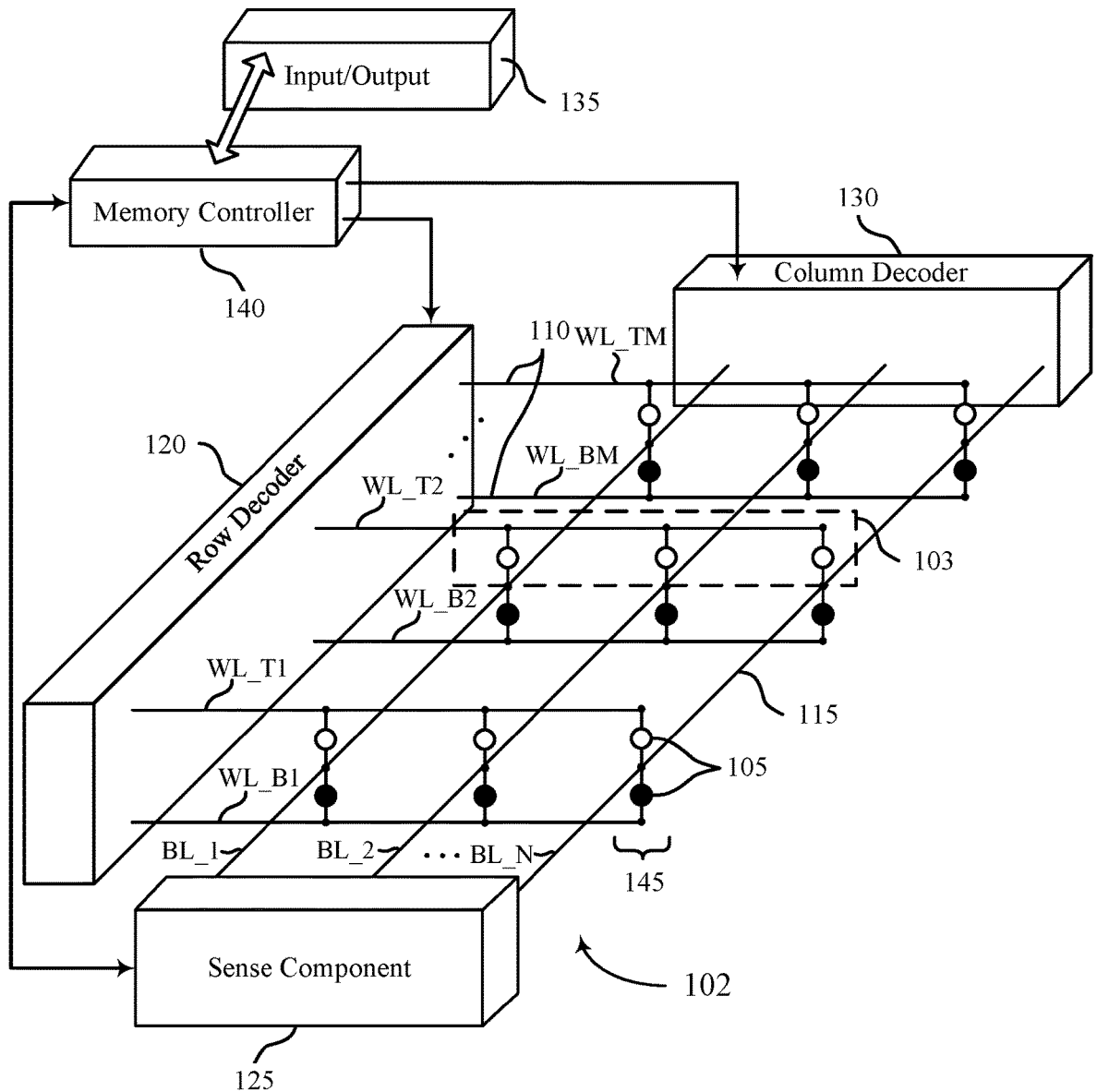
FIG. 1 illustrates an example of a system that supports implementations to store fuse data in memory devices in accordance with examples as disclosed herein.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing an access line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be coupled with the bottom electrode of the upper memory cell 105 and the top electrode of the lower memory cell 105. Other configurations may be possible, for example, a third deck may share a word line 110 with a lower deck. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are coupled with (e.g., connected to) the same word line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive material, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting word line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled BL_1 through BL_N, where M and N depend on the array size. Thus, by activating a word line 110 and a bit line 115, e.g., WL_2 and BL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, a memory cell 105 may be programmed by providing an electric pulse to the cell, which may include a memory storage element. The pulse may be provided via word line 110, bit line 115, or a combination thereof.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or coupled with column decoder 130 or row decoder 120. The sense component may be associated either with column decoder or row decoder.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying the first voltage to the memory cell 105 as part of the access operation based on coupling the first conductive line of the decoder (e.g., row decoder 120 or column decoder 130) with the access line (e.g., word line 110 or bit line 115).

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with an access line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. In some cases, the second voltage may cause the doped material to selectively couple the first conductive line of the decoder with the access line associated with the memory cell 105. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may store a logic state in the memory cell 105 based on applying the first voltage to the memory cell 105.

Figure 2:
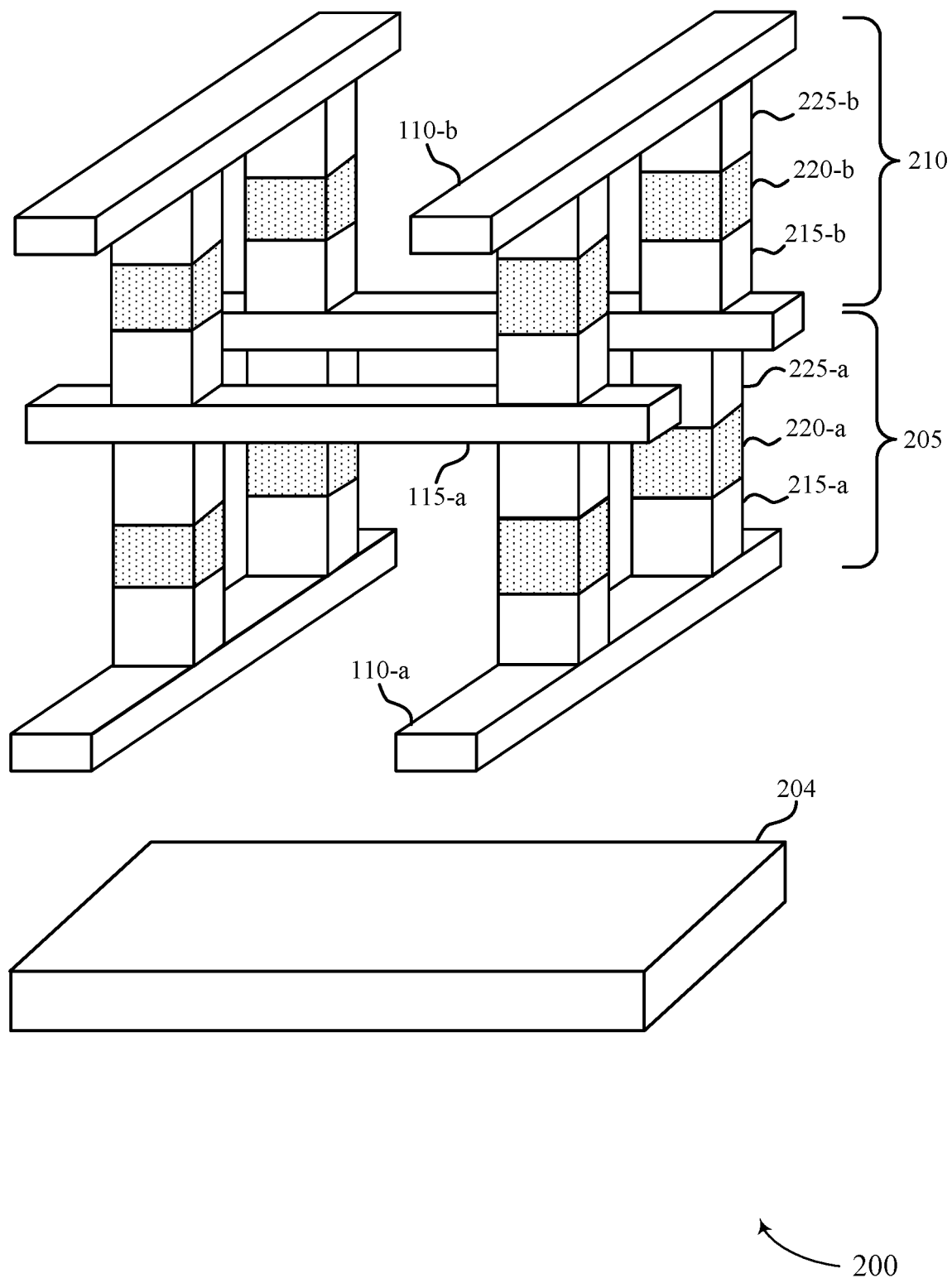
FIG. 2 illustrates an example of a memory die that supports implementations to store fuse data in memory devices in accordance with examples as disclosed herein.

FIG. 2 illustrates an example of a memory array 200 that supports implementations to store fuse data in memory devices as disclosed herein. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-a and word line 110-b, and bit line 115-a, which may be examples of word line 110 and bit line 115, as described with reference to FIG. 1. Memory cells of the first deck 205 and the second deck 210 each may have one or more memory cell (e.g., memory cell 220-a and memory cell 220-b, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-a, memory cell 220-a (e.g., including chalcogenide material), and second electrode 225-a. In addition, memory cells of the second deck 210 may include a first electrode 215-b, memory cell 220-b (e.g., including chalcogenide material), and second electrode 225-b. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-b of the second deck 210 and the second electrode 225-a of the first deck 205 may be coupled to bit line 115-a such that bit line 115-a is shared by vertically adjacent memory cells. In accordance with the teachings herein, a decoder may be positioned above or below each deck if the memory array 200 includes more than one deck. For example, a decoder may be positioned above first deck 205 and above second deck 210. In some cases, the memory cells 220 may be examples of phase-change memory cells or self-selecting memory cells.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 220 including chalcogenide material may be programmed to a logic state by applying a first voltage. By way of example, when a particular memory cell 220 is programmed, elements within the cell separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

In some cases, a first voltage may be applied to a first conductive line of a decoder as part of an access operation of the memory cell 220. Upon applying the first voltage, the first conductive line may be coupled with the access line (e.g., word line 110-a, word line 110-b, or bit line 115-a) associated with the memory cell 220. For example, the first conductive line may be coupled with the access line based on a doped material of the decoder which extends between the first conductive line and the access line in a first direction.

In some examples, the first voltage may be applied to the memory cell 220 based on coupling the first conductive line of the decoder with the access line. The decoder may include one or more doped materials that extend between the first conductive line and the access line of the memory array 200 of memory cells in a first direction away from a surface of the substrate 204. In some cases, the decoder may be coupled with the substrate 204.

Figure 3:
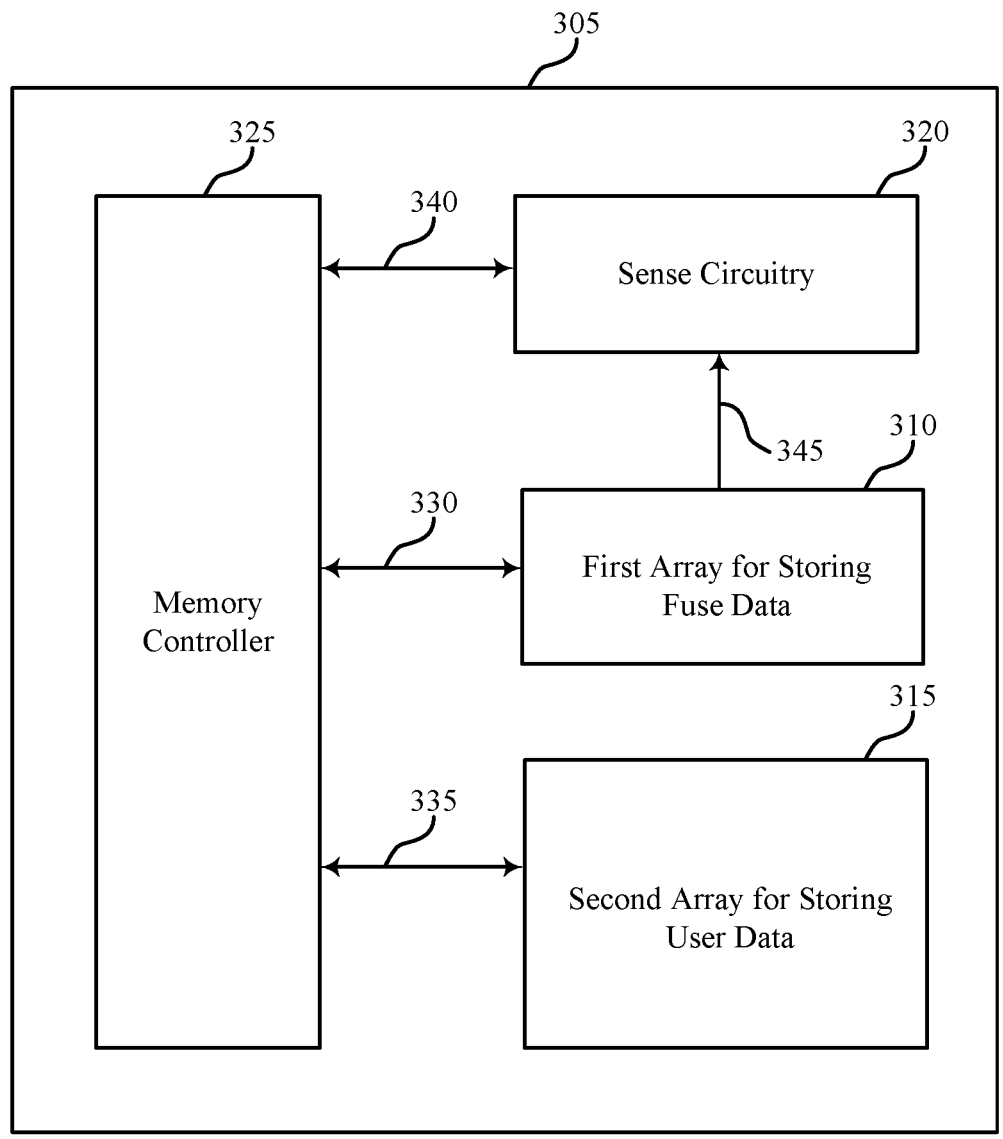
FIG. 3 illustrates an example of a block diagram of a memory device that supports implementations to store fuse data in memory devices in accordance with examples as disclosed herein.

FIG. 3 illustrates an example of a block diagram of a memory device 300 that supports implementations to store fuse data in memory devices in accordance with examples as disclosed herein. A memory device 305 may include a first array 310 for storing fuse data, a second array 315 for storing user data, and sense circuitry 320. The first array 310 for storing fuse data, the second array 315 for storing user data, and the sense circuitry 320 may each be coupled with the memory controller 325 using one or more communication lines 330, 335, and 340, respectively. In addition, the first array 310 for storing fuse data may be coupled with the sense circuitry 320 using communication line 345.

The first array 310 and the second array 315 may be examples of the memory device 100 described with reference to FIG. 1. The arrays 310 and 315 may include a number of memory cells. The first array 310 for storing fuse data may be configured to store information used to operate the memory device. Fuse data, in some cases, may include operating information such as redundancy information (e.g., information indicative of defective components within the memory device), and trimming information (e.g., information regarding device specific adjustments to internal characteristics and operating parameters of the memory device), among other information. In some cases, the first array 310 for storing fuse data may include memory cells containing chalcogenide. Additionally, the first array 310 may occupy a smaller area on the memory device 305 as compared to the second array 315 for storing user data.

In some cases, a memory array (e.g., the first array 310) may be configured within the memory device 305 to store fuse data instead of storing the data in a dedicated fuse array at the periphery of the memory device 305. Storing the fuse data in the first array 310 may have a number of benefits as compared to other methods, which may store fuse data in fuses or fuse-like structures (e.g., various poly-silicon resistors or other metallic resistive components) that need to be "blown" by driving a threshold amount of current through the fuse link. For example, instead of irreversibly "blowing" fuses using a comparatively large driver component (e.g., a MOSFET transistor, a bipolar transistor, and the link), the first array 310 may contain memory cells containing a chalcogenide element, which may be reprogrammable. And, because the cells of the first array 310 do not need to be blown (but rather programmed), the quantity and/or the size of current drivers present at the memory device 305 may be reduced. In addition, the first array 310 may use less area on the memory device 305 as compared to a separate number of fuses located at the periphery of the array. Further, the first array 310 for storing fuse data may be better integrated with other components located in more central portions of the memory device 305, such as additional sense circuitry 320, a memory controller 325, and a second array 315 for storing user data.

In some cases, the first array 310 for storing fuse data may be located in various locations in the memory device 305. For example, as previously described, the first array 310 for storing fuse data may be a sub-array located within the greater portion of the memory device 305, and may be integrated with other components, such as the second array 315 for storing user data. In other examples, the first array 310 may be separate from the greater portion of the memory array (e.g., separate from the portion of the array storing user data). In either or both cases, the first array 310 may store the information allocated to fuses, such as certain binary states represented in fuse data.

The second array 315 for storing user data may be configured to store user data, which may include a codeword, page, or other value received from a host device (e.g., a personal computer). User data may typically include data generated by the user logic which is stored and retrieved in memory that could otherwise be used for different data types. The second array 315 may in some cases include memory cells containing chalcogenide. In other cases, the second array 315 may contain other types of memory cells (e.g., ferroelectric cells).

The sense circuitry 320 may include other circuit elements configured to perform functions of the memory device 305. In some cases, the sense circuitry 320 may be coupled with the first array 310 for storing fuse data. The sense circuitry 320 may be configured to receive a number of signals indicating the value of fuse data stored in the first array 310. The second array 315 may in some cases be coupled with sense circuitry 320, or may in some other cases be coupled with a different set of sense circuitry.

In some examples, the first array 310 for storing fuse data may use a single memory cell or a small set of memory cells that may be programmed in the same state (e.g., a "1" or a "0") to store a single value of fuse data. In such examples, a read operation may include non-differential (e.g., single-ended) signaling to determine the value of fuse data stored in the memory cells.

In one example, the sense circuitry 320 may employ non-differential (e.g., single-ended) signaling techniques to determine the value of fuse data stored in the first array 310. For example, sense circuitry 320 may receive a signal over the communication line 345 from the first array 310, and may compare the signal received over the communication line 345 to a given fixed reference potential or reference signal. The sense circuitry 320 may send to the memory controller 325, an output signal indicating the value of the fuse data stored in the first array 310 based on comparing the signal received over the communication line 345 to the given fixed reference potential.

In other examples, sense circuitry 320 may employ differential signaling techniques to determine the value of the fuse data stored in the first array 310, where two complementary signals may be used to output a signal indicative of the value of the fuse data. The output signal may be a single-ended signal or a differential signal. In some cases, the sense circuitry 320 may extract information by detecting a potential difference between the two complementary signals used in the differential signal.

The first array 310 for storing fuse data may include two memory cells or two separate sets of memory cells that may be programmed in opposite or complementary states (e.g., "1" and "0") based on fuse data values. For example, a first state corresponding to a first value of fuse data is programmed to a first memory cell or portion of memory cells, and the complementary state for the first value of fuse data is programmed to a second memory cell or portion of memory cells. In such examples, the first state may correspond to the true value of the fuse data stored using the differential techniques and the second state may correspond to a complementary value of the true value of the fuse data stored using the differential techniques. Differential signaling techniques may be used to determine the value of fuse data stored in the memory cells.

Sense circuitry 320 may receive a first signal from the first portion of memory cells located at the first array 310, and may receive a second signal from the second portion of memory cells. As the second portion of memory cells is programmed in the opposite or complementary state as the first portion of memory cells, the second signal may similarly be the complement of the first signal (e.g., the second signal may have equal amplitude and opposite polarity to the first signal). In some cases, the first signal and the second signal may be sent as a differential signal pair.

The sense circuitry 320 may compare the first signal with the second signal, and may output to the memory controller 325, a differential signal which may indicate the value of the fuse data stored in the first array 310. Stated alternatively, sense circuitry 320 may compare the two complementary signals and may determine the value of the fuse data stored in the first array 310 based on the comparing.

The differential signaling and storage techniques used may have a number of benefits. For example, the differential signaling may be more reliable (e.g., accurate) than non-differential alternatives, based on the use of two signals instead of one. In addition, differential signaling may be more resistant to noise and electromagnetic interference, and may be more suitable for low power applications and applications where signal-to-noise ratio values pose challenges to signal accuracy.

The first array 310 for storing fuse data, the second array 315 for storing user data, and sense circuitry 320 may output a number of signals to memory controller 325. Memory controller 325 may be an example of the memory controller 140 as described with reference to FIG. 1. In some cases, the memory controller may be configured to access the second array 315 for storing user data based on the fuse data stored in the first array 310.

Figure 4:
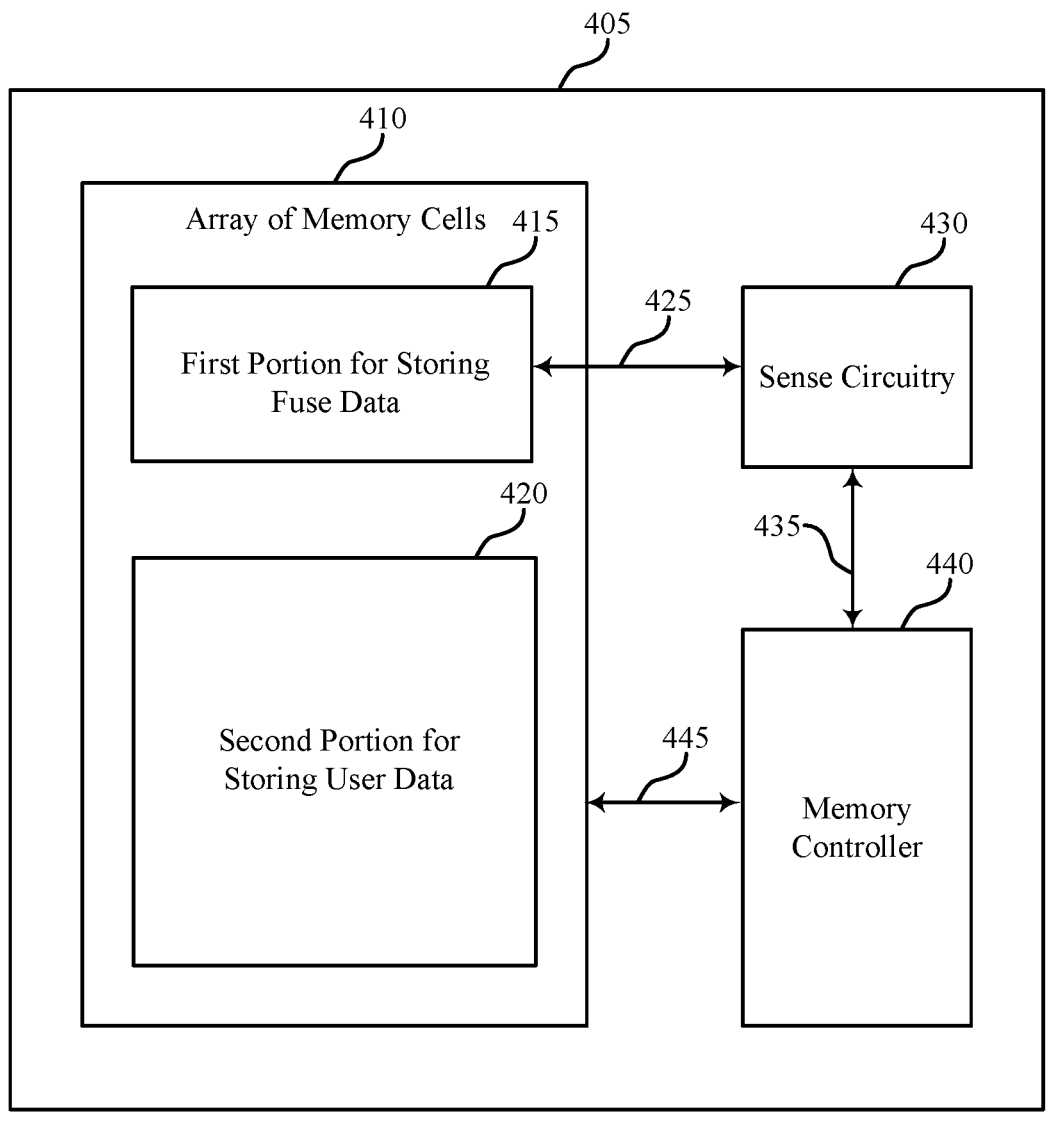
FIG. 4 illustrates an example of a block diagram of a memory device that supports implementations to store fuse data in memory devices in accordance with examples as disclosed herein.

FIG. 4 illustrates an example of a block diagram of a memory device 400 that supports implementations to store fuse data in memory devices in accordance with examples as disclosed herein. A memory device 405 may include an array 410 of memory cells which may include a first portion 415 for storing fuse data, and a second portion 420 for storing user data. The array 410 of memory cells (including the first portion 415 for storing fuse data and the second portion 420 for storing user data) along with sense circuitry 430 may be coupled with the memory controller 440 using one or more communication lines 435 and 445, respectively. In addition, the first portion 415 for storing fuse data may be coupled with sense circuitry 430 using communication line 425.

In some implementations, the array 410 may include memory cells containing a chalcogenide storage element. Accordingly, the first portion 415 for storing fuse data and the second portion 420 for storing user data may similarly include memory cells containing chalcogenide. In such implementations a single memory array including chalcogenide storage elements may store both fuse data and user data. In some cases, however, the portion (e.g., first portion 415) of the array 410 used for fuse data may be coupled with sense circuitry that is different than sense circuitry used for the portion (e.g., second portion 420) of the array 410 used for user data.

The first portion 415 for storing fuse data within the memory array 410 may be an alternative to including a dedicated fuse array at the periphery of the memory array, or as an array separate from the greater portion of the memory array containing the user data. In some examples, the first portion 415 storing fuse data may be an array or subarray of memory cells contained within the memory array 410, and may be further integrated with portions of the array containing user data (e.g., second portion 420). Similar to the configuration described with reference to FIG. 3, because the cells of the memory device corresponding to the first portion for storing fuse data do not need to be blown (but rather programmed), the quantity and/or size of current drivers may be reduced and the device may be reprogrammable.

The array 410 of memory cells along with the first portion 415 and the second portion 420 may each be examples of the memory device 100 described with reference to FIG. 1. The array 410, including portions 415, and 420 may include a number of memory cells. The first portion 415 for storing fuse data may be configured to store information used to operate the memory device, including redundancy information and trimming information. In some cases, the first portion 415 for storing fuse data may occupy a smaller area on the memory device 405 as compared to the second portion 420 for storing user data.

The second portion 420 for storing user data may be configured to store user data, which may include a codeword, page, or other value received from a host device (e.g., a personal computer). User data may typically include data generated by the user logic which is stored and retrieved in memory that could otherwise be used for different data types.

The sense circuitry 430 may include other circuit elements configured to perform functions of the memory device 405. In some cases, the sense circuitry 320 may be coupled with the first portion 415 for storing fuse data. The sense circuitry 430 may be configured to receive a number of signals indicating the value of fuse data stored in the first portion 415. In some cases, a different set of sense circuitry may be coupled with the second portion 420 and may be configured to retrieve data stored in the second portion 420.

In some examples, the first portion 415 for storing fuse data may use a single memory cell or a small set of memory cells programmed to the same state (e.g., a "1" or a "0") to store a single value of fuse data. In such examples, non-differential (e.g., single-ended) signaling may be employed to determine the value of fuse data stored in the memory cells.

In some examples, the sense circuitry 430 may implement non-differential (e.g., single-ended) storage and signaling techniques to determine the value of fuse data stored in the first portion 415 for storing fuse data. For example, sense circuitry 430 may compare the signal received over the communication line 425 from the first portion 415 to a given fixed reference potential. The sense circuitry 430 may send to the memory controller 440, an output signal indicating the value of the fuse data stored in the first portion 415 based on comparing the signal received over communication line 425 to the given fixed reference potential.

In other examples, sense circuitry 430 may employ differential storage and signaling techniques to determine the value of the fuse data stored in the first portion 415, where two complementary signals may be used to output a signal indicative of the value of the fuse data. The output signal may be a single-ended signal or a differential signal. In some cases, the sense circuitry 430 may extract information by detecting a potential difference between the two complementary signals used in the differential signal.

The first portion 415 for storing fuse data may include two memory cells or two separate sets of memory cells that may be programmed in opposite or complementary states (e.g., "1" and "0" binary states) based on fuse data values. Such arrangements may be examples of differential storage techniques. For example, a first state corresponding to a first value of fuse data is programmed to a first memory cell or group of memory cells, and the complementary state for the first value of fuse data is programmed to a second memory cell or group of memory cells. In such examples, the first state may correspond to the true value of the fuse data stored using the differential techniques and the second state may correspond to a complementary value of the true value of the fuse data stored using the differential techniques. Differential signaling techniques may be used to determine the value of fuse data stored in the memory cells.

Sense circuitry 430 may receive a first signal from the first group of memory cells located at the first portion 415 for storing fuse data, and may receive a second signal from the second group of memory cells. As the second group of memory cells is programmed in the opposite or complementary state as the first group of memory cells, the second signal may similarly be the complement of the first signal (e.g., the second signal may have equal amplitude and opposite polarity to the first signal). In some cases, the first signal and the second signal may be sent as a differential signal pair.

The sense circuitry 430 may compare the first signal with the second signal, and may output to the memory controller 440, a differential signal which may indicate the value of the fuse data stored in the first portion 415. Stated alternatively, sense circuitry 430 may compare the two complementary signals and may determine the value of the fuse data stored in the first portion 415 based on the comparing.

The array 410 of memory cells (containing the first portion 415 for storing fuse data, and the second portion 420 for storing user data) along with sense circuitry 430 may output various signals to memory controller 440. Memory controller 440 may be an example of the memory controller 140 as described with reference to FIG. 1. In some cases, the memory controller 440 may be configured to access the array 410 of memory cells and the second portion 420 for storing user data based on the fuse data stored in the first portion 415.

Figure 5A:
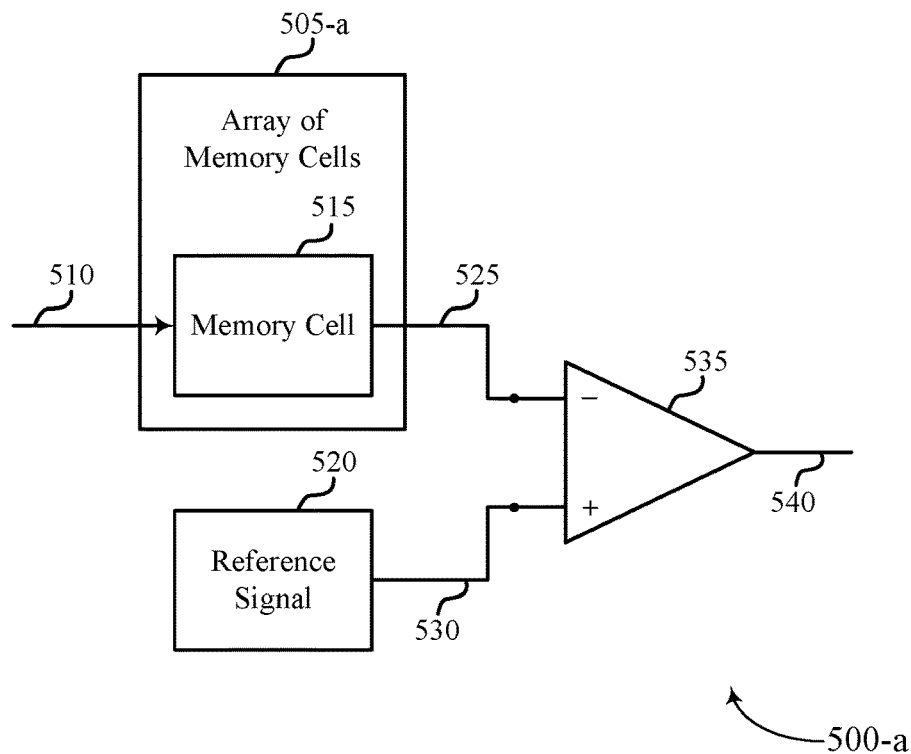
FIGS. 5A and 5B illustrate examples of block diagrams of signaling operations that support implementations to store fuse data in memory devices in accordance with examples as disclosed herein.

FIG. 5A illustrates an example of a block diagram 500-a of a signaling operation that supports implementations to store fuse data in memory devices in accordance with examples as disclosed herein. The array 505-a of memory cells may include a memory cell 515 which may contain a chalcogenide element. In the example of block diagram 500-a, the memory cell 515 is depicted as a single memory cell, however the techniques described herein may similarly apply to groups of memory cells.

In some examples, the memory cell 515 may be programmed to a certain state (e.g., either a "1" or a "0" binary state) based on a given true value of fuse data. In cases where the memory cell 515 is programmed in a single state (e.g., no complementary programming of different sets of memory cells), non-differential (e.g., single-ended) sensing techniques may be implemented at the memory device. A read pulse 510 may be applied to the memory cell 515 which may cause the memory cell 515 to output signal 525 in response to the read pulse 510. A reference signal 520, which may in some cases be a fixed reference signal or reference potential, may be output at 530. Signals 530 and 525 may be further processed using sense circuitry 535. Sense circuitry 535 may include a non-differential current mode sense amplifier. The sense circuitry 535 may output signal 540 indicating the value of the fuse data stored in the memory cell 515 based on comparing the value of fuse data to the given reference potential of reference signal 520.

In some examples, the reference potential or reference signal 520 may be fixed. Alternatively, the reference signal may be a moving reference which may maintain a constant voltage separation with the signal produced at the memory cell 515 with respect to time. The non-differential current mode sense amplifier that may be used in sense circuitry 535 may include a pin designated for the input current (e.g., signal 525), and a separate pin designated for the reference signal. The non-differential current mode sense amplifier may additionally include a pin designated for an output signal. In general, the input signals from the memory cell 515 may be compared with the reference signal 520 to produce the output signal 540.

Figure 5B:
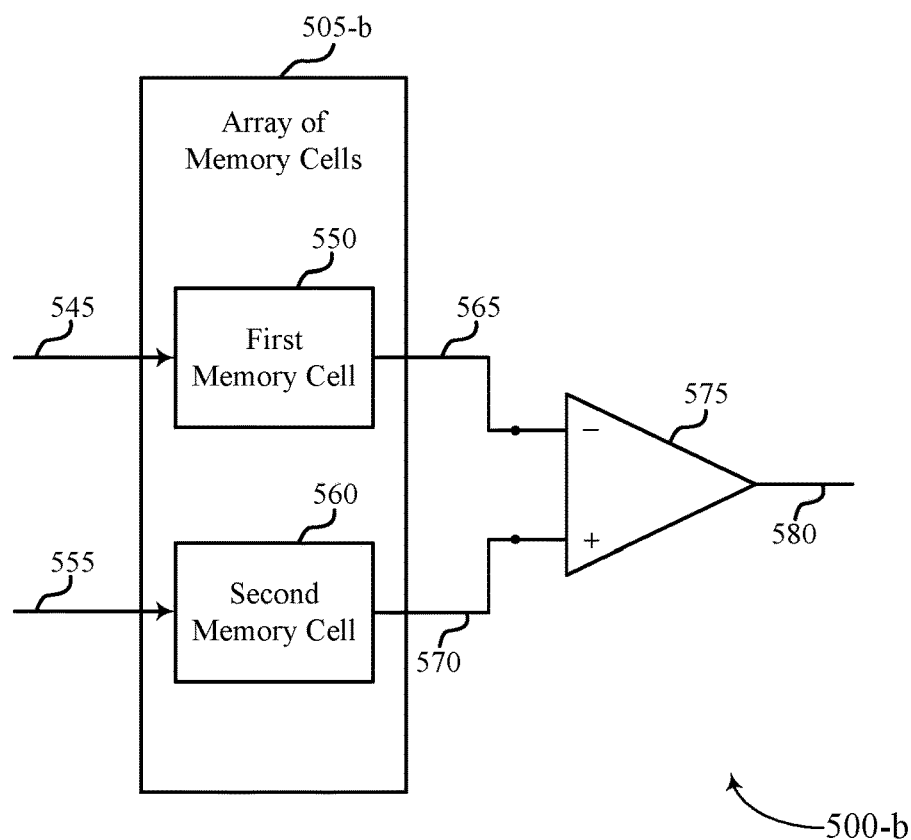

FIG. 5B illustrates an example of a block diagram 500-b of a signaling operation that supports implementations to store fuse data in memory devices in accordance with examples as disclosed herein. The array 505-b of memory cells may include a first memory cell 550 and a second memory cell 560. Both memory cells 550 and 560 may contain a chalcogenide element. In the example of block diagram 500-b, the first memory cell 550 and the second memory cell 560 are depicted as single memory cells, however the techniques described herein may be similarly applied to groups of memory cells.

In some examples, the first memory cell 550 and the second memory cell 560 are programmed to implement differential storage techniques. For example, the first memory cell 550 may be programmed to a certain binary state (e.g., either a "1" or "0") based on the true value of the fuse data, and the second memory cell 560 may be programmed in the opposite (e.g., complementary) state to that stored in the first memory cell 550. Stated alternatively, in examples where the first memory cell 550 stores a "1" state, the second memory cell 560 may store a "0" state, and in other examples where the first memory cell 550 stores a "0" state, the second memory cell 560 may store a "1" state.

A first state corresponding to a first value of fuse data is programmed to the first memory cell 550, and the complementary state for the first value of fuse data is programmed to the second memory cell 560. In such examples, the first state may correspond to the true value of the fuse data stored using the differential techniques, and the second state may correspond to a complementary value of the true value of the fuse data stored using the differential techniques.

In some cases, fuse data stored in the memory arrays 505 (e.g., memory array 505-a described with reference to FIG. 5A and memory array 505-b described with reference to FIG. 5B) may contain redundancy and trimming information, along with other information used to operate the memory device. The information may indicate defective components, adjustments to operating parameters, and so on. In some cases, the fuse data may be stored or programmed to the memory arrays 505 during manufacturing (e.g., before being implemented at the user device). In some cases, however, additional manufacturing processes may occur after the fuse data is stored. For example, the memory arrays 505 containing the programmed fuse data may be soldered to a package or may be otherwise integrated at a separate device such as a graphics processing unit (GPU) or other computing device after manufacture. In some cases, however, the additional manufacturing processes may introduce a number of external stresses on the memory arrays 505 which may in some cases disrupt the fuse data stored previously in the memory arrays 505.

Storing and signaling fuse data using differential techniques such as those described herein may be advantageous, for example, in cases where the memory device or memory array is subject to an external stress or disruption after manufacture. In one example, the memory array 505-b storing fuse data may be subject to increased thermal stress from high temperatures used in soldering, which may disrupt the stored data states in the memory array 505-b. In cases where differential storage is used, however, a single value of fuse data may be stored as two complementary states (e.g., as a "0" and "1"). In some cases, a first state may be stored in the first memory cell 550, and a second complementary state may be stored in the second memory cell 560, and the value of the fuse data may be determined by a difference between the two complementary states, rather than by the value of an individual stored state. As a result, disruptions may occur proportionally across the stored states, such that the difference between the stored states remains constant even when subject to high temperatures or other stresses. Using differential storage techniques may reduce a likelihood that thermal events, such as soldering, introduces errors into the fuse data stored in reprogrammable memory cells, as compared to using single-ended storage techniques where a single memory cell value is compared with a reference.

In another example, the differential signaling and storage methods described herein may be less affected by input signal noise as compared to non-differential methods. The value of fuse data may be stored as two complementary states, and signal noise may affect each state in similar ways. As a result, the differential value between the two states may remain constant, and the output of the fuse data may be more reliably determined. In some cases, the noise from signals 565 and 570 may appear as a common-mode voltage at the sense circuitry 575.

In cases where the first memory cell 550 and the second memory cell 560 are programmed to opposite states, differential sensing techniques may be implemented to determine the value of fuse data stored in the memory cells. Read pulses 545 and 555 may be respectively applied to the first memory cell 550 and the second memory cell 560, and may cause the memory cells 550 and 560 to output signals 565 and 570 in response to the read pulses. Signal 565 may include the first state stored in the first memory cell 550, and signal 570 may include the second state stored in the second memory cell 560. The read pulses 545 and 555 may in some cases have the same polarity, and in other cases may have different polarities.

Signals 565 and 570 may be further processed using sense circuitry 575. In this case, sense circuitry 575 may include a differential current mode sense amplifier. The differential current mode sense amplifier may include input pins designated for signals 565 and 570 from both the first memory cell 550 and the second memory cell 560, respectively. In some cases, signals 565 and 570 may be examples of input currents. The first state stored in the first memory cell 550 and the second state stored in the second memory cell 560 may in some cases be a pair of differential states representing the true value of fuse data stored in the array of memory cells.

In some cases, the differential current mode sense amplifier may include a single output, or may alternatively include two output pins for two output voltages in a differential configuration. Sense circuitry 575 may compare the two complementary signals from the first memory cell 550 and the second memory cell 560, and may determine the value of the fuse data stored in the array based on the comparing. For example, the differential current mode sense amplifier may determine the value of fuse data by detecting a differential voltage level between the signals 565 and 570. Stated alternatively, determining whether the fuse data is a "1" or a "0" state is based on the voltage difference between the complementary signals. Sense circuitry 575 may generate an output signal 580 based on comparing the signals 565 and 570 from the first memory cell 550 and the second memory cell 560. The output signal may in some case be a differential signal which indicates the value of the fuse data stored in the array 505-b of memory cells. In addition, the output signal may be proportional to the difference between signals 565 and 570.

In some cases, storing and reading fuse data using differential techniques may increase the accuracy or reliability of the output signal, as the differential current mode sense amplifier may account for signal noise (SNR considerations), low power signals, or other signal variance. In addition, the differential sensing scheme may allow for fast reads, and may operate according to low power considerations.

Figure 6:
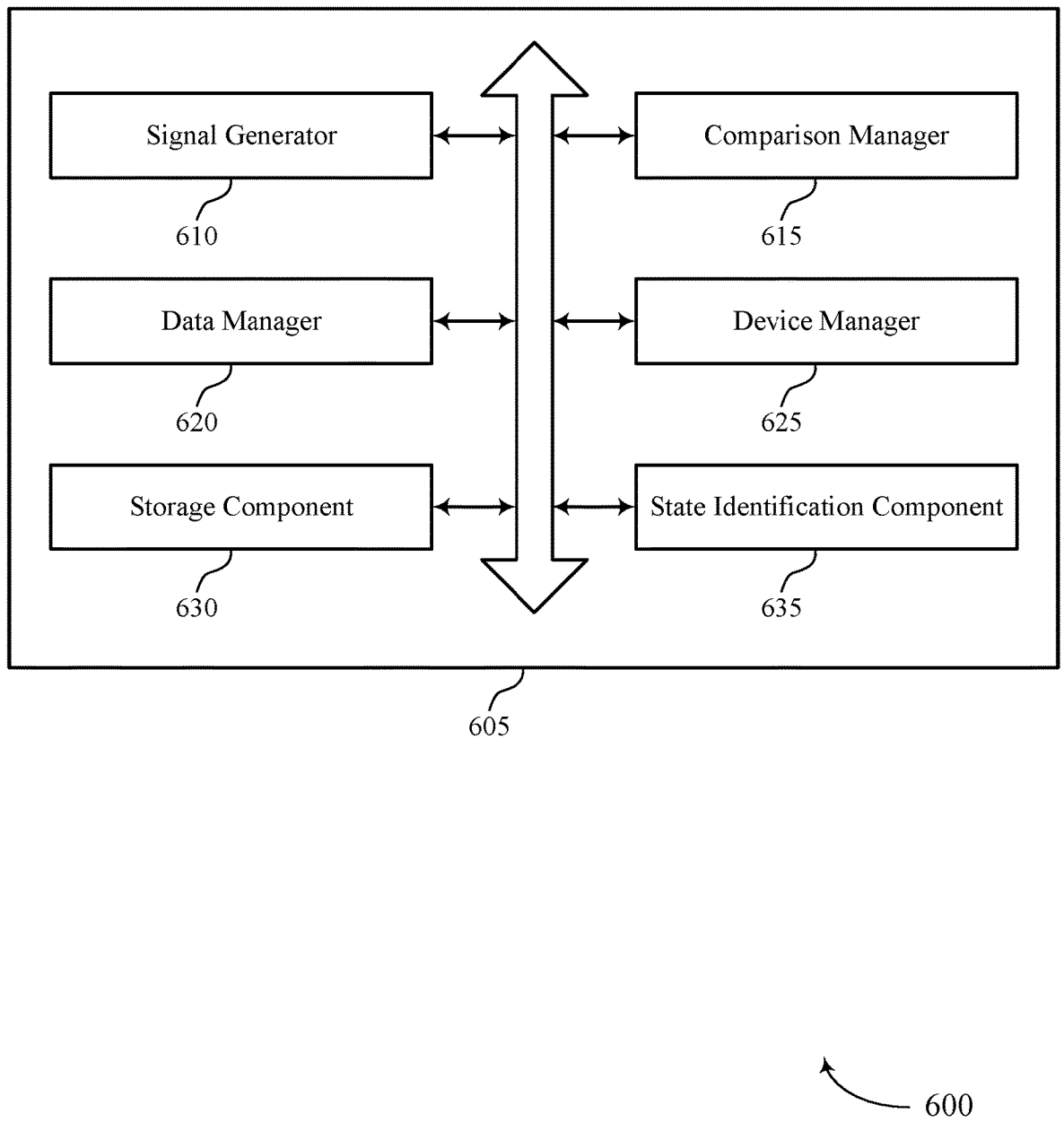
FIG. 6 illustrates a block diagram of a memory device that supports implementations to store fuse data in memory devices in accordance with examples as disclosed herein.

FIG. 6 shows a block diagram 600 of a memory device 605 that supports implementations to store fuse data in memory devices in accordance with examples as disclosed herein. The memory device 605 may be an example of at least portions of a memory device as described with reference to FIGS. 1-5. The memory device 605 may include a signal generator 610, a comparison manager 615, a data manager 620, a device manager 625, a storage component 630, and a state identification component 635. Each of these modules may communicate, directly or indirectly, with one another (e.g., via one or more buses).

The signal generator 610 may generate a first signal that indicates a first state stored in a first set of memory cells of a memory device and a second signal that indicates a second state stored in a second set of memory cells of the memory device, the second state being a complement of the first state. In some examples, the signal generator 610 may apply a first read pulse having a first polarity to the first set of memory cells, where generating the first signal is based on applying the first read pulse to the first set of memory cells.

In some examples, the signal generator 610 may apply a second read pulse having the first polarity to the second set of memory cells, where generating the second signal is based on applying the second read pulse to the second set of memory cells. In some examples, the signal generator 610 may apply a first read pulse having a first polarity to the first set of memory cells, where generating the first signal is based on applying the first read pulse to the first set of memory cells. In some examples, the signal generator 610 may apply a second read pulse having a second polarity to the second set of memory cells, where generating the second signal is based on applying the second read pulse to the second set of memory cells. In some examples, the signal generator 610 may output a differential signal that indicates the value of the fuse data.

The comparison manager 615 may compare the first signal that indicates the first state with the second signal that indicates the second state. The data manager 620 may identify a value of fuse data of the memory device based on the comparing the first signal with the second signal.

The device manager 625 may operate the memory device based on the value of the fuse data. In some cases, the memory device includes an array of memory cells for storing the fuse data and user data, the array of memory cells including a chalcogenide element in the memory cells. In some cases, the first set of memory cells and the second set of memory cells include a portion of subarray dedicated to storing the fuse data of the array of memory cells. In some cases, the first set of memory cells includes a single memory cell and the second set of memory cells includes a single memory cell. In some cases, the first signal and the second signal include a differential pair of signals that indicate the value of the fuse data.

The storage component 630 may identify the first state to store in the first set of memory cells and the second state to store in the second set of memory cells based on the value of the fuse data, the first state and the second state representing the value of the fuse data. In some examples, the storage component 630 may store the first state in the first set of memory cells and the second state in the second set of memory cells. In some cases, the first state stored on the first set of memory cells and the second state stored on the second set of memory cells include a differential pair of states that represent the value of the fuse data.

The state identification component 635 may identify the first state stored in the first set of memory cells, where generating the first signal is based on identifying the first state. In some examples, the state identification component 635 may identify the second state stored in the second set of memory cells, where generating the second signal is based on identifying the second state.

Figure 7:
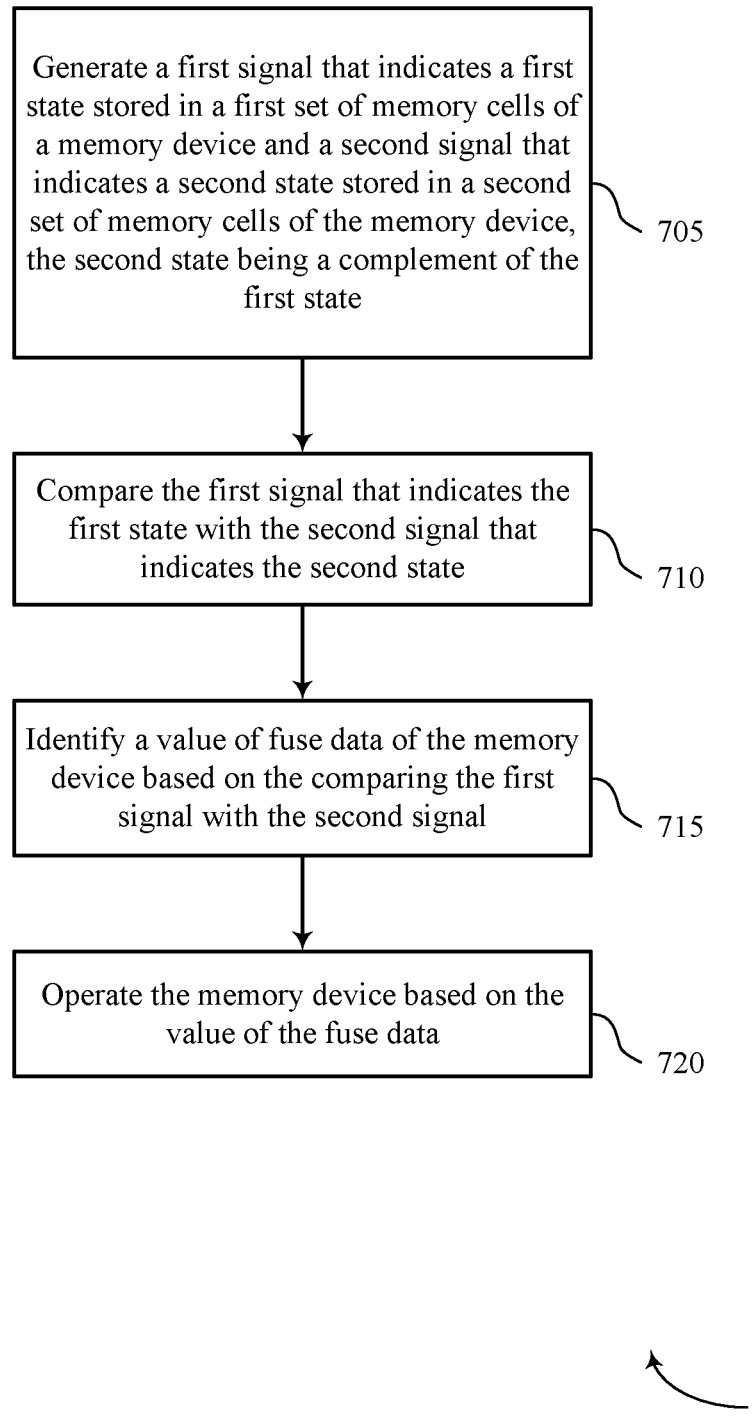
FIG. 7 illustrates a flowchart showing a method or methods that support implementations to store fuse data in memory devices in accordance with examples as disclosed herein.

FIG. 7 shows a flowchart illustrating a method or methods 700 that supports implementations to read fuse data in memory devices in accordance with examples as disclosed herein. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform portions of the described functions using special-purpose hardware.

At 705, the memory device may generate a first signal that indicates a first state stored in a first set of memory cells of a memory device and a second signal that indicates a second state stored in a second set of memory cells of the memory device, the second state being a complement of the first state. The operations of 705 may be performed according to the methods described herein. In some examples, operations of 705 may be performed by a signal generator as described with reference to FIG. 6.

At 710, the memory device may compare the first signal that indicates the first state with the second signal that indicates the second state. The operations of 710 may be performed according to the methods described herein. In some examples, operations of 710 may be performed by a comparison manager as described with reference to FIG. 6.

At 715, the memory device may identify a value of fuse data of the memory device based on the comparing the first signal with the second signal. The operations of 715 may be performed according to the methods described herein. In some examples, operations of 715 may be performed by a data manager as described with reference to FIG. 6.

At 720, the memory device may operate the memory device based on the value of the fuse data. The operations of 720 may be performed according to the methods described herein. In some examples, operations of 720 may be performed by a device manager as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for generating a first signal that indicates a first state stored in a first set of memory cells of a memory device and a second signal that indicates a second state stored in a second set of memory cells of the memory device, the second state being a complement of the first state, comparing the first signal that indicates the first state with the second signal that indicates the second state, identifying a value of fuse data of the memory device based on the comparing the first signal with the second signal, and operating the memory device based on the value of the fuse data.

In some examples of the method 700 and the apparatus described herein, the memory device includes an array of memory cells for storing the fuse data and user data, the array of memory cells including a chalcogenide element in the memory cells, and the first set of memory cells and the second set of memory cells include a portion of subarray dedicated to storing the fuse data of the array of memory cells. In some examples of the method 700 and the apparatus described herein, the first state stored on the first set of memory cells and the second state stored on the second set of memory cells include a differential pair of states that represent the value of the fuse data.

Some examples of the method 700 and the apparatus described herein may further include operations, features, means, or instructions for identifying the first state to store in the first set of memory cells and the second state to store in the second set of memory cells based on the value of the fuse data, the first state and the second state representing the value of the fuse data, and storing the first state in the first set of memory cells and the second state in the second set of memory cells.

Some examples of the method 700 and the apparatus described herein may further include operations, features, means, or instructions for applying a first read pulse having a first polarity to the first set of memory cells, where generating the first signal may be based on applying the first read pulse to the first set of memory cells, and applying a second read pulse having the first polarity to the second set of memory cells, where generating the second signal may be based on applying the second read pulse to the second set of memory cells.

Some examples of the method 700 and the apparatus described herein may further include operations, features, means, or instructions for applying a first read pulse having a first polarity to the first set of memory cells, where generating the first signal may be based on applying the first read pulse to the first set of memory cells, and applying a second read pulse having a second polarity to the second set of memory cells, where generating the second signal may be based on applying the second read pulse to the second set of memory cells.

Some examples of the method 700 and the apparatus described herein may further include operations, features, means, or instructions for outputting a differential signal that indicates the value of the fuse data. Some examples of the method 700 and the apparatus described herein may further include operations, features, means, or instructions for identifying the first state stored in the first set of memory cells, where generating the first signal may be based on identifying the first state, and identifying the second state stored in the second set of memory cells, where generating the second signal may be based on identifying the second state.

In some examples of the method 700 and the apparatus described herein, the first set of memory cells includes a single memory cell and the second set of memory cells includes a single memory cell. In some examples of the method 700 and the apparatus described herein, the first signal and the second signal include a differential pair of signals that indicate the value of the fuse data.

It should be noted that the methods described above describe possible implementations, and that the operations and the steps may be rearranged or otherwise modified and that other implementations are possible.

An apparatus is described. The apparatus may include an array of memory cells including a first portion of memory cells for storing fuse data, a second portion of memory cells for storing user data, the memory cells in the first portion and the memory cells in the second portion each including a chalcogenide element, sense circuitry coupled with the first portion of memory cells and configured to identify a value of fuse data stored in the first portion of memory cells, and a controller coupled with the array of memory cells and the sense circuitry and configured to access the array of memory cells based on the fuse data stored in the first portion of memory cells.

In some examples, the sense circuitry may be configured to receive, from the first portion of memory cells, a differential signal indicating the value of the fuse data stored in the first portion of memory cells, the differential signal including a first signal from a first set of the first portion of memory cells and a second signal from a second set of the first portion of memory cells. Some examples may further include comparing the first signal with the second signal to identify the value of the fuse data, and output a second differential signal that indicates the value of the fuse data based on the comparison. In some examples, the value of the fuse data may be stored in at least two memory cells including a first memory cell storing a first state associated with the value and a second memory cell storing a second state associated with the value.

In some examples, the first state and the second state include a differential pair of states that represent the value of the fuse data. In some examples, the sense circuitry may be configured to receive a signal from the first portion of memory cells indicating the value of the fuse data and compare the signal to a reference signal to identify the value of the fuse data. Some examples of the apparatus may include a fuse array for storing the fuse data. Some examples may further include at least a portion of the fuse data that may be stored on both the fuse array and the first portion of memory cells of the array of memory cells.

In some examples, the value of the fuse data may be stored in a single memory cell of the first portion of memory cells. In some examples, the first portion of memory cells for storing the fuse data may be reprogrammable. In some examples, the controller may be configured to prevent unauthorized access to the first portion of memory cells. In some examples, the fuse data includes information used by a memory device to operate the memory device, and the user data includes information received from a host device and that may be stored on the memory device.

An apparatus is described. The apparatus may include a first array of memory cells of a first type and configured to store user data, a second array of memory cells of a second type, the second array including a chalcogenide element and configured to store fuse data associated with operating the first array of memory cells, sense circuitry coupled with the second array of memory cells and configured to identify values of the fuse data stored in the second array, and a controller coupled with the first array, the second array, and the sense circuitry and configured to access memory cells of the first array based on the sense circuitry identifying values of the fuse data stored in the second array.

In some examples, the sense circuitry may be configured to receive a differential signal from the second array that includes a first signal from a first set of memory cells and a second signal from a second set of memory cells, the differential signal indicating a value of the fuse data stored in the second array.

In some examples, a value of the fuse data may be stored in at least two memory cells of the second array including a first memory cell storing a first state and a second memory cell storing a second state.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   an array of memory cells comprising:
   a first portion of memory cells for storing fuse data;
   a second portion of memory cells for storing user data, the memory cells in the first portion and the memory cells in the second portion each comprising a chalcogenide element;
   sense circuitry coupled with the first portion of memory cells and configured to identify a value of fuse data stored in the first portion of memory cells, wherein the sense circuitry is configured to receive, from the first portion of memory cells, a differential signal indicating the value of the fuse data stored in the first portion of memory cells, the differential signal comprising a first signal from a first set of the first portion of memory cells and a second signal from a second set of the first portion of memory cells; and
   a controller coupled with the array of memory cells and the sense circuitry and configured to access the array of memory cells based at least in part on the fuse data stored in the first portion of memory cells.

2. The apparatus of claim 1, wherein the sense circuitry is configured to:
   compare the first signal with the second signal to identify the value of the fuse data; and
   output a second differential signal that indicates the value of the fuse data based at least in part on the comparison.

3. The apparatus of claim 1, wherein the value of the fuse data is stored in at least two memory cells including a first memory cell storing a first state associated with the value and a second memory cell storing a second state associated with the value.

4. The apparatus of claim 3, wherein the first state and the second state comprise a differential pair of states that represent the value of the fuse data.

5. The apparatus of claim 1, wherein the sense circuitry is configured to receive a signal from the first portion of memory cells indicating the value of the fuse data and compare the signal to a reference signal to identify the value of the fuse data.

6. The apparatus of claim 1, wherein the value of the fuse data is stored in a single memory cell of the first portion of memory cells.

7. The apparatus of claim 1, wherein the first portion of memory cells for storing the fuse data is reprogrammable.

8. The apparatus of claim 1, wherein the controller is configured to prevent unauthorized access to the first portion of memory cells.

9. The apparatus of claim 1, wherein:
   the fuse data comprises information used by a memory device to operate the memory device; and
   the user data comprises information received from a host device and that is stored on the memory device.

10. The apparatus of claim 1, wherein the second signal is a complement of the first signal.

11. A method, comprising:
    generating a first signal that indicates a first state stored in a first set of memory cells of a memory device and a second signal that indicates a second state stored in a second set of memory cells of the memory device, the second state being a complement of the first state;
    comparing the first signal that indicates the first state with the second signal that indicates the second state;
    identifying a value of fuse data of the memory device based at least in part on the comparing the first signal with the second signal; and
    operating the memory device based at least in part on the value of the fuse data.

12. The method of claim 11, wherein:
    the memory device comprises an array of memory cells for storing the fuse data and user data, the array of memory cells comprising a chalcogenide element in the memory cells; and
    the first set of memory cells and the second set of memory cells comprise a portion of subarray dedicated to storing the fuse data of the array of memory cells.

13. The method of claim 11, wherein the first state stored on the first set of memory cells and the second state stored on the second set of memory cells comprise a differential pair of states that represent the value of the fuse data.

14. The method of claim 11, further comprising:
    identifying the first state to store in the first set of memory cells and the second state to store in the second set of memory cells based at least in part on the value of the fuse data, the first state and the second state representing the value of the fuse data; and storing the first state in the first set of memory cells and the second state in the second set of memory cells.

15. The method of claim 11, further comprising:
applying a first read pulse having a first polarity to the first set of memory cells, wherein generating the first signal is based at least in part on applying the first read pulse to the first set of memory cells; and
applying a second read pulse having the first polarity to the second set of memory cells, wherein generating the second signal is based at least in part on applying the second read pulse to the second set of memory cells.

16. The method of claim 11, further comprising:
applying a first read pulse having a first polarity to the first set of memory cells, wherein generating the first signal is based at least in part on applying the first read pulse to the first set of memory cells; and
applying a second read pulse having a second polarity to the second set of memory cells, wherein generating the second signal is based at least in part on applying the second read pulse to the second set of memory cells.

17. The method of claim 11, further comprising:
outputting a differential signal that indicates the value of the fuse data.

18. The method of claim 11, further comprising:
identifying the first state stored in the first set of memory cells, wherein generating the first signal is based at least in part on identifying the first state; and
identifying the second state stored in the second set of memory cells, wherein generating the second signal is based at least in part on identifying the second state.

19. The method of claim 11, wherein the first set of memory cells comprises a single memory cell and the second set of memory cells comprises a single memory cell.

20. The method of claim 11, wherein the first signal and the second signal comprise a differential pair of signals that indicate the value of the fuse data.

* * * * *